US010964867B2

(12) United States Patent
Brodoceanu et al.

(10) Patent No.: US 10,964,867 B2
(45) Date of Patent: Mar. 30, 2021

(54) USING UNDERFILL OR FLUX TO PROMOTE PLACING AND PARALLEL BONDING OF LIGHT EMITTING DIODES

(71) Applicant: Facebook Technologies, LLC, Menlo Park, CA (US)

(72) Inventors: Daniel Brodoceanu, Cork (IE); Thiago Martins Amaral, Saarbrücken (DE); Pooya Saketi, Cork (IE); Patrick Joseph Hughes, Cork (IE); Alexander Udo May, St. Ingbert (DE); Karsten Moh, Saarbrücken (DE); Oscar Torrents Abad, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/425,866

(22) Filed: May 29, 2019

(65) Prior Publication Data

US 2020/0111939 A1 Apr. 9, 2020

Related U.S. Application Data

(60) Provisional application No. 62/742,838, filed on Oct. 8, 2018.

(51) Int. Cl.
*H01L 21/67* (2006.01)
*H01L 33/62* (2010.01)
(Continued)

(52) U.S. Cl.
CPC ............ *H01L 33/62* (2013.01); *B23K 1/0016* (2013.01); *B23K 1/0056* (2013.01); *B23K 1/203* (2013.01);
(Continued)

(58) Field of Classification Search
USPC .......................... 438/22, 241, 46, 47; 257/88
See application file for complete search history.

(56) References Cited

U.S. PATENT DOCUMENTS 10,186,549 B1 * 1/2019 Cheung ............... H05K 3/4007
2009/0017566 A1   1/2009 Basin et al.
(Continued)

FOREIGN PATENT DOCUMENTS

JP      2011222830 A    11/2011
KR    20160086789 A     7/2016
WO  WO 2018/082100 A1   5/2018

OTHER PUBLICATIONS

PCT International Search Report and Written Opinion, PCT Application No. PCT/US2019/054472, dated Jan. 15, 2020, 13 pages.

*Primary Examiner* — Long K Tran
(74) *Attorney, Agent, or Firm* — Fenwick & West LLP

(57) ABSTRACT

Embodiments relate to using flux or underfill as a trapping layer for temporarily attaching light emitting diodes (LEDs) to a substrate and heating to simultaneously bond multiple LEDs onto the substrate. The flux or underfill may be selectively coated at the ends of electrodes of the LEDs prior to placing the LEDs on the substrate. Due to adhesive properties of the flux or underfill, multiple LEDs can be placed on and attached to the substrate prior to performing the bonding process. Once LEDs are placed on the substrate, the flux or underfill facilitates formation of metallic contacts between electrodes of the LED and contacts of the substrate during the bonding process. By using the flux or underfill, the formation of metallic contacts can be performed even without applying pressure.

13 Claims, 13 Drawing Sheets

(51) Int. Cl.
  *H01L 33/56*  (2010.01)
  *H01L 25/075*  (2006.01)
  *B23K 1/20*  (2006.01)
  *B23K 1/005*  (2006.01)
  *B23K 1/00*  (2006.01)
  *B23K 101/36*  (2006.01)
  *H01L 33/30*  (2010.01)

(52) U.S. Cl.
  CPC .. *H01L 21/67144* (2013.01); *H01L 21/67259* (2013.01); *H01L 25/0753* (2013.01); *H01L 33/56* (2013.01); *B23K 2101/36* (2018.08); *H01L 33/30* (2013.01); *H01L 2933/005* (2013.01); *H01L 2933/0066* (2013.01)

(56) References Cited

U.S. PATENT DOCUMENTS

| | | | |
|---|---|---|---|
| 2009/0233117 A1* | 9/2009 | Sakai | H05K 3/3489 428/551 |
| 2010/0259164 A1 | 10/2010 | Oohata et al. | |
| 2012/0217287 A1* | 8/2012 | Kumar | B23K 1/0016 228/178 |
| 2013/0089937 A1 | 4/2013 | Chern et al. | |
| 2013/0337615 A1* | 12/2013 | Xu | H01L 24/27 438/125 |
| 2016/0218025 A1 | 7/2016 | Tischler et al. | |
| 2017/0373046 A1 | 12/2017 | Gardner et al. | |
| 2018/0069148 A1 | 3/2018 | Zou et al. | |
| 2018/0069149 A1* | 3/2018 | Zou | H01L 27/15 |
| 2020/0094336 A1* | 3/2020 | Ikushima | G06F 30/367 |

* cited by examiner

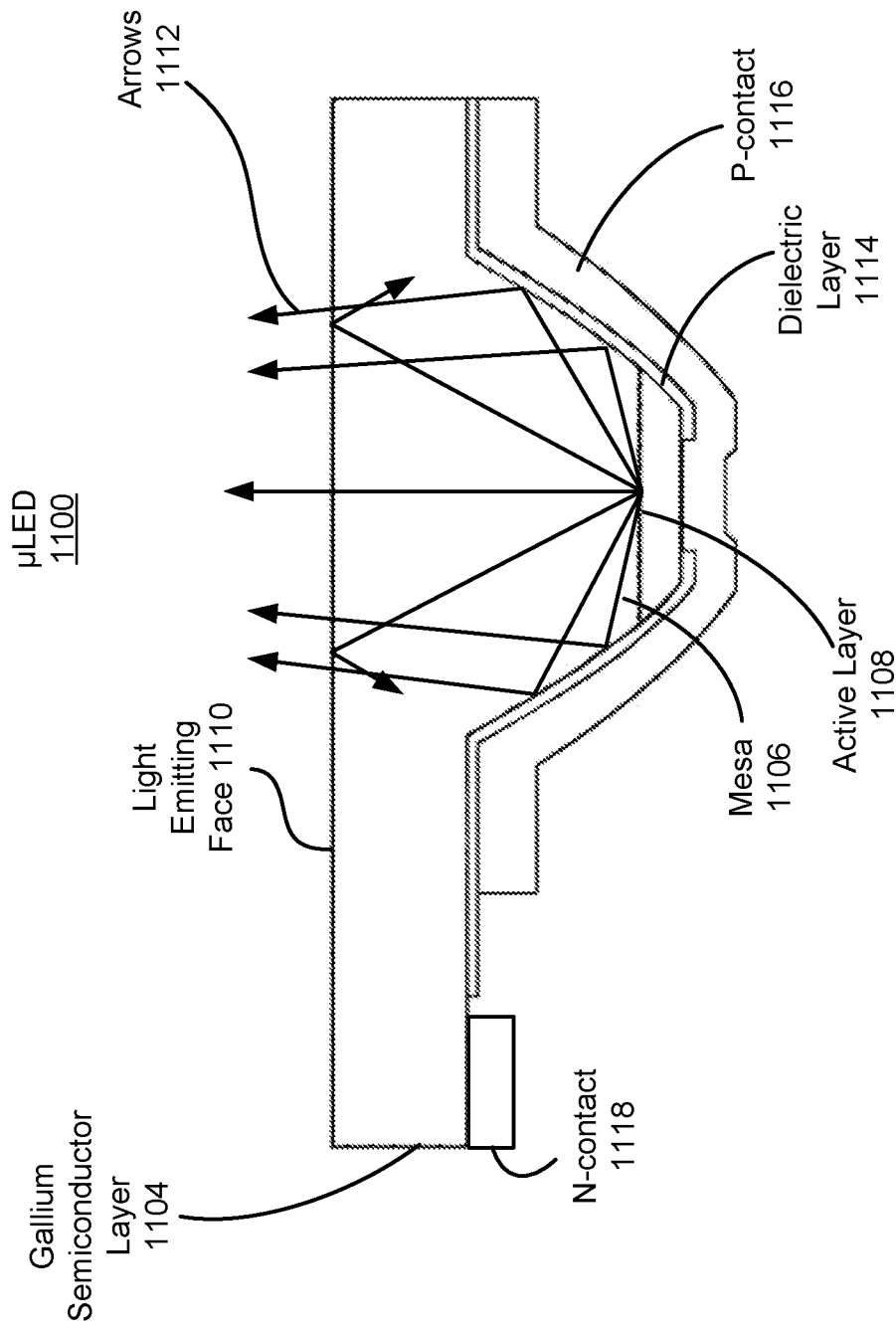

US 10,964,867 B2

USING UNDERFILL OR FLUX TO PROMOTE PLACING AND PARALLEL BONDING OF LIGHT EMITTING DIODES

BACKGROUND

The present disclosure relates to placing and bonding light emitting diodes (LEDs) on a substrate, and specifically, to applying a flux or underfill between the LEDs and substrate to promote the placing and bonding processes.

In display fabrication, LEDs may be moved from one substrate to another. For example, micro-LEDs (μLEDs) for emitting different colors of light may be transferred from native substrates (on which the micro-LEDs) are fabricated or carrier substrates to a display substrate including control circuits for the μLEDs to manufacture an electronic display. As the form factor of LEDs decreases, the placing of LEDs into desired arrangements without damaging the LED dies becomes increasingly difficult.

Furthermore, LEDs are bonded to a substrate by thermo-compression (TC) bonding to form metallic contacts between the LED and substrate. TC bonding forms metallic contacts between two metals by simultaneously applying force and heat. To ensure each LED is bonded correctly, the placing and bonding process is applied to one LED at a time. Specifically, once an LED is placed on a substrate, it is bonded to the substrate before another LED is placed on the substrate. As a result, the substrate and previously bonded LEDs undergo multiple heating cycles. Repeated high temperature heating cycles is time consuming, increases the risk of damaging LEDs, and can lead to the formation of oxide layers at the metallic contacts.

SUMMARY

Embodiments relate to using flux or underfill as a trapping layer for temporarily attaching light emitting diodes (LEDs) to a substrate and heating to simultaneously bond multiple LEDs onto the substrate. Electrodes of a light emitting diode (LED) die are aligned with contacts of a substrate. Flux or underfill is provided on at least the electrodes or the contacts. The LED die is placed on the substrate with the flux or underfill as a trapping layer between the electrodes and the contacts. The electrodes, the contacts, and the flux or underfill are heated to form a metallic contact between the LED die and the substrate.

In some embodiments, a pick-up head for placing the LED die on the substrate is detached from the first LED die after placing the LED die on the substrate. Adhesive forces of the flux or underfill secure the LED die on the substrate during the detachment of the pick-up head from the LED die.

In some embodiments, another LED die is placed on the substrate prior to the heating process. The other LED die may be placed on the substrate simultaneously with the placing of the LED die on the substrate.

In some embodiments, the metallic contact is formed without applying external pressure on the first LED die towards the substrate during the heating.

In some embodiments, pressure is applied on the first LED die towards the substrate by placing the first LED die and the substrate in a high-pressure chamber during the heating.

In some embodiments, a platform with an elastomer pad is placed on the first LED die. Pressure is applied on the first LED die towards the substrate by applying pressure on the platform with the elastomer pad.

In some embodiments, the flux or underfill is provided on the electrodes, and at least tips of the electrodes are coated with the flux or underfill by dipping the tips into a flux or underfill layer.

In some embodiments, the flux or underfill is rosin or Benzocyclobutene (BCB).

In some embodiments, subsequent to placing the first LED die on the substrate, the first LED die is repositioned to align the electrodes with the contacts. The flux of underfill remains between the electrodes and the contact.

In some embodiments, the first LED die is repositioned based on image signals received from a camera. The camera captures images of the first LED die through a microscope lens.

BRIEF DESCRIPTION OF DRAWINGS

FIGS. 11A through 11C are schematic cross sections of a micro (μLED), according to some embodiments.

The figures depict various embodiments of the present disclosure for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digits of each reference number correspond to the figure in which the reference number is first used.

Embodiments relate to using flux or underfill as a trapping layer for temporarily attaching light emitting diodes (LEDs) to a substrate and heating to simultaneously bond multiple LEDs onto the substrate. The flux or underfill may be selectively coated at the ends of electrodes of the LEDs prior to placing the LEDs on the substrate. Due to adhesive properties of the flux or underfill, multiple LEDs can be placed on and attached to the substrate prior to performing the bonding process. Once LEDs are placed on the substrate, the flux or underfill facilitates formation of metallic contacts between electrodes of the LED and contacts of the substrate during the bonding process. By using the flux or underfill, the formation of metallic contacts can be performed without applying pressure.

Figure 1A:
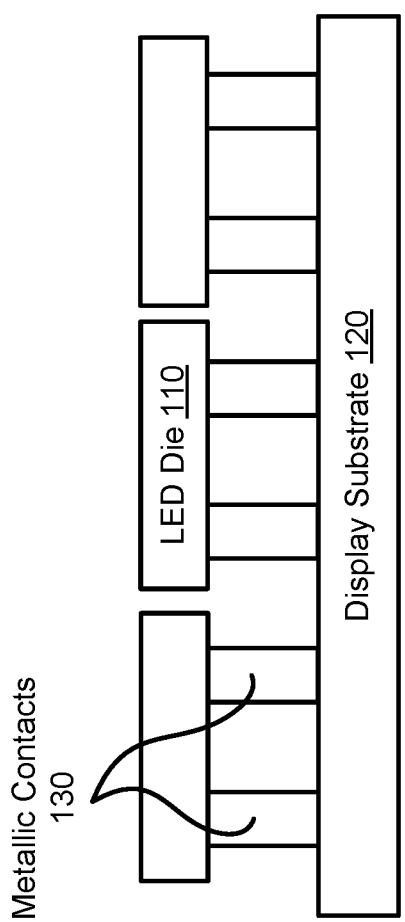
FIG. 1A is a cross sectional view of LED dies bonded to a substrate by metallic contacts, according to one embodiment.
Figure 1B:
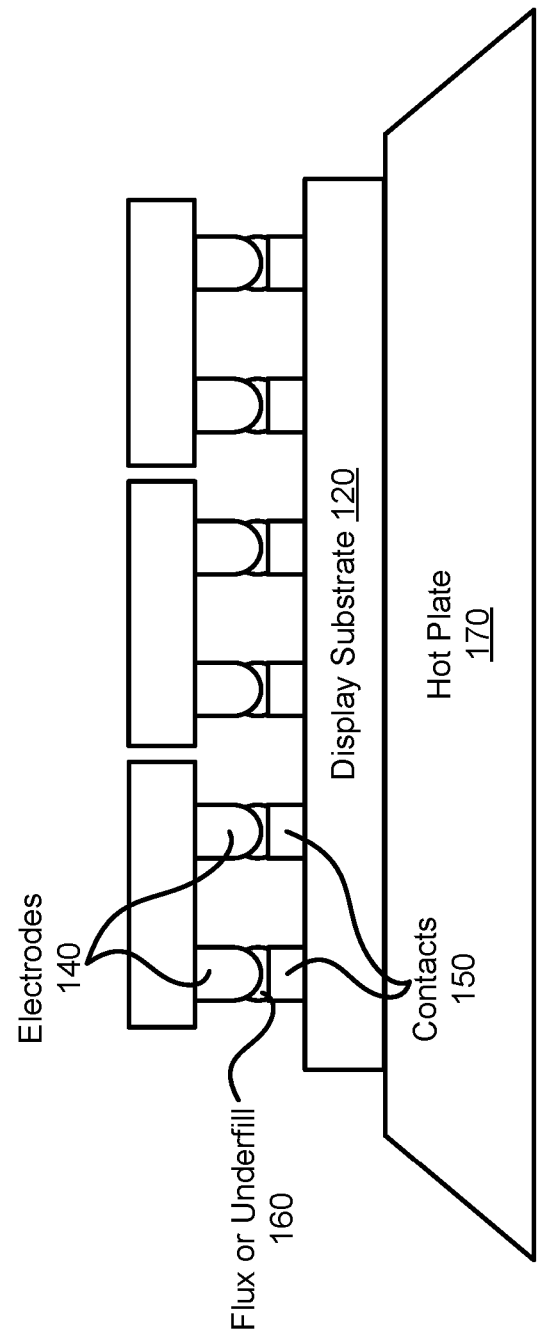
FIG. 1B is a cross sectional view of LED dies placed on the substrate prior to bonding, according to one embodiment.

FIG. 1A is a cross sectional view of LED dies 110 bonded to a display substrate 120 by metallic contacts 130, according to one embodiment. FIG. 1B is a cross sectional view of LED dies 110 placed on the display substrate 120 prior to bonding, according to one embodiment. The electrodes 140 of the LED dies 110 are aligned with and temporarily attached to conducting contacts 150 of the display substrate 120 by the flux or underfill 160. During bonding, part of the electrodes 140, part of the contacts 150, and flux or underfill 160 melt to form the metallic contacts 130. This can be done in parallel for multiple LEDs 110 placed on the display substrate 120.

In FIG. 1B, the display substrate 120 is on top of a hot plate 170 to heat the electrodes 140, the contacts 150 and the flux or underfill 160. However, different mechanisms may be used to heat the assembly such as exposing the electrodes 140, the contact 150, and the flux or underfill 160 to a laser beam.

An LED 110 is a surface-mounted device (SMD) that emits light if a voltage difference is applied between the electrodes 140. The electrodes 140 can be made of a single metal (e.g., gold (Au)) or alloys (e.g., copper (Cu) and tin (Sn) or gold (Au) and tin (Sn)). The electrodes 140 may be nanoporous. An LED 110 can have an epitaxial structure formed from, among other examples, Gallium nitride (GaN), gallium arsenide (GaAs), or gallium phosphide (GaP). In some embodiments, the LED 110 is a micro-LED (µLED) die. The LED 110 may also be embodied as a vertical-cavity surface-emitting laser (VCSEL) that emits infrared wavelengths.

The electrodes 140 of the LED 110 can be aligned with and paced on contacts of 150 the display substrate 120 by a pick-up head. Alternatively, an array of LEDs 110 and their electrodes 140 can be aligned with and placed on an array of contacts 150 in a single step (this may be referred to as a monolithic approach). In some embodiments, the circuits in the display substrate 120 are powered so that the LED 110 emits light 128 as soon as electrical contact is established during the placement process, as described with reference to FIGS. 7-10.

The display substrate 120 mechanically supports electronic components (such as the LEDs 110) and electrically connects the electronic components using traces (not shown) and contacts 150. For example, the display substrate is a semiconductor substrate with traces, contacts and other electronic components fabricated using complementary metal-oxide-semiconductor (CMOS) technology. In some embodiments, the contacts 150 are alloys that include copper (Cu). The display substrate 120 can support any number of LEDs 110. The display substrate 120 may include circuits that are completed once one or more LEDs 110 are placed onto the display substrate 120. In some embodiments, the display substrate 120 can include a control circuit that drives current in the display substrate 120. For example, the display substrate 120 is a display substrate of an electronic display. In this example, the LEDs may be placed (e.g., by a pick-up head) at pixel or sub-pixel locations to connect the LED dies to control circuits in the display substrate. In this way, the control circuit can drive the electronic display by applying current to the LED dies 110.

The metallic contacts 130 are electrical connections between the electrodes 140 of the LEDs 110 and the contacts 150 of the display substrate 120. The metallic contacts 130 are formed by bonding the electrodes 140 to the contacts 150. Depending on the material of the electrodes and the contacts 150, the metallic contacts 130 may be a metallic bond (e.g., a pure gold or copper bond) or an intermetallic bond (e.g., a gold-tin or copper-tin alloy bond). The metallic contacts 130 are formed during the bonding process by heating the electrodes 140, contacts 150, and flux or underfill 160. Pressure may also be applied to form the metallic contacts 130. When both heat and pressure are applied, the process is referred to as thermocompression (TC) bonding. However, applying pressure on LEDs 110 during bonding may cause misalignment. Hence, in some embodiments, the metallic contacts 130 are formed without applying external pressure or applying only reduced pressure to the LEDs 110 towards the display substrate 120 during the bonding process.

The hot plate 170 is a plate that can control the temperature of the electrodes 140, contacts 150, and flux or underfill 160 by heating or cooling the display substrate 120. The hot plate 170 may be advantageous for bonding the contacts 150 to the electrodes 140. For example, due to heat from the hot plate 170, the electrodes 140, contacts 150, and flux or underfill 160 melt to form the metallic contact 130. The hot plate 170 may be a Peltier cell when bonding temperatures are low (e.g., −20° C. to 90° C.). The bonding temperatures may be low when the flux or underfill includes rosin. In some embodiments, the temperature of the electrodes 140, contacts 150, and flux or underfill 160 is controlled by another (or additional) method or apparatus, such as a laser beam that locally heats the electrodes 140, contacts 150, and flux or underfill 160. For example, after multiple LEDs 110 are placed, a laser setup may be employed to selectively heat individual LEDs 110. A laser setup may be employed when bonding temperatures are high (e.g., 250° C. to 300° C.). Bonding temperatures may be high to bond metals (e.g., to form a copper-tin bond).

The flux or underfill 160 promotes bonding of the electrodes 140 to the contacts 150 to form the metallic contacts 130. The flux or underfill 160 placed between the electrodes 140 and contacts 150 may be referred to herein as a 'trapping layer' because the flux or underfill 150 temporarily holds the electrodes 140 in place so that the electrodes 140 can bond with the contacts 150. The flux or underfill 160 is any combination of underfill material, flux material, and underfill material with flux properties. Examples of flux or underfill 160 include, but are not limited to, rosin or other similar flux types, epoxy based materials, and Benzocyclobutene (BCB) based materials. Examples of other materials that can be used as a trapping layer include, but are not limited to, conductive paste formulations (e.g., silver nanoparticle ink), low melting point metals (e.g., indium), nanoporous gold, and eutectic alloys. Flux material remove oxides (e.g., Cu or Sn oxides) during the bonding process because the oxides may prevent formation the metallic contacts 130. Thus, in embodiments where oxidation does not occur or is reduced during the bonding process (e.g., the electrodes 140 and contacts 150 are gold or the bonding process occurs in a reduced atmosphere environment), the flux or underfill 160 may not include flux material. In some embodiments, the flux or underfill 160 mechanically strengthens the bond structure. During the bonding process, the flux or underfill 160 may turn liquid around 50° C., may become active by removing oxides around 80-110° C., and may assist bonding by decreasing surface tension around 230° C.

In some embodiments, if flux or underfill 160 is placed between the electrodes 140 and contacts 150, the bonding process can form metallic contacts 130 without applying external pressure on the LEDs 110 towards the display substrate 120. During heating, the flux or underfill 160 can decrease the surface tension of the melted electrodes 140 and contacts 150. The flux or underfill 160 can pull the opposing surfaces of the electrodes 140 and contacts 150 together due to capillary forces and mass loss during thermal decomposition. This may particularly occur when the dimensions of the LED dies 110 are on the order of micrometers. The flux or underfill 160 can also allow effective wetting of both surfaces of the electrodes 140 and contacts 150. Adhesive properties of the flux or underfill 160 can maintain the position of the placed LED 110 on the substrate (e.g., the flux or underfill 160 maintains contact between the electrodes 140 and contacts 150) during the bonding process. Due to any combination of these features, the metallic contacts 130 can be formed without applying external pressure to the LEDs 110.

In some embodiments, the flux or underfill functions as the trapping layer having adhesive properties to assist in the temporary placement of the LEDs 110 on the display substrate 120. For example, flux or underfills 160 can be become solid below certain temperatures (e.g., rosin is solid below 50° C.), allowing multiple LEDs 110 to be placed on the display substrate 120 prior to the bonding process. For example, after placement of an LED 110 by a pick-up head, the pick-up head can detach from the LED 110 due the adhesive forces of the flux or underfill 160 keeping the LED 110 attached to the display substrate 120, so that any number of LEDs 110 can form metallic contacts 130 with the display substrate 120 during a single bonding process. Among other advantages, a single bonding process for forming metallic contacts 130 can reduce a need to remove oxide layers formed on metallic contacts 130 after multiple thermal cycles. A single bonding process can also reduce a risk of damaging the LEDs 110 from multiple thermal cycles. A single bonding process can also be less time consuming than multiple bonding processes. A single bonding process can also reduce a risk of dendrites formation.

Furthermore, the temporary attachment of LEDs 110 to the contacts 150 by the flux or underfill 160 can allow LEDs 110 to be repositioned after alignment. For example, after multiple LEDs 110 are aligned and placed, misplaced LEDs 110 can be repositioned prior to bonding.

Figure 2A:
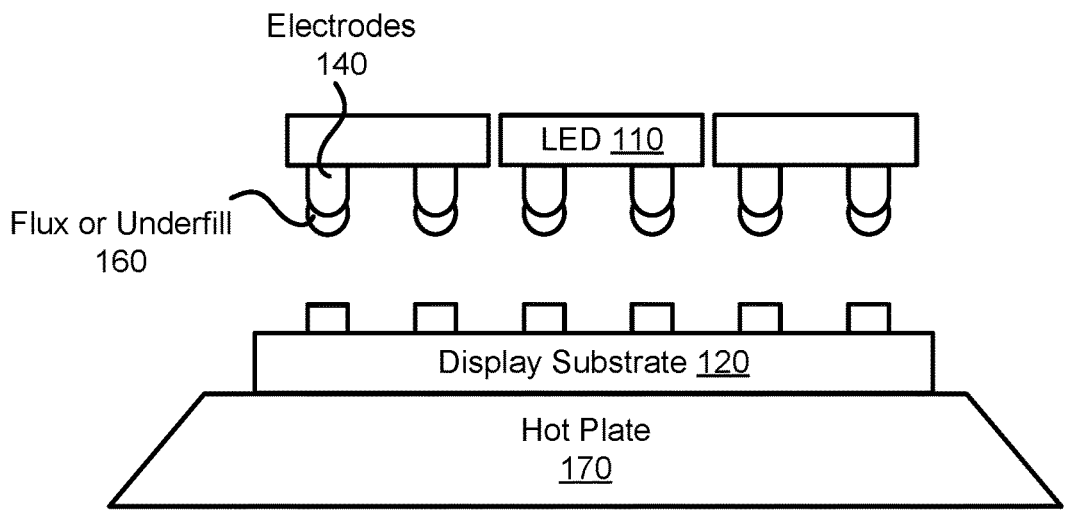
FIGS. 2A-2C illustrate a sequence of schematic diagrams for bonding electrodes of LED dies and contacts of the substrate, according to one embodiment.
Figure 2B:
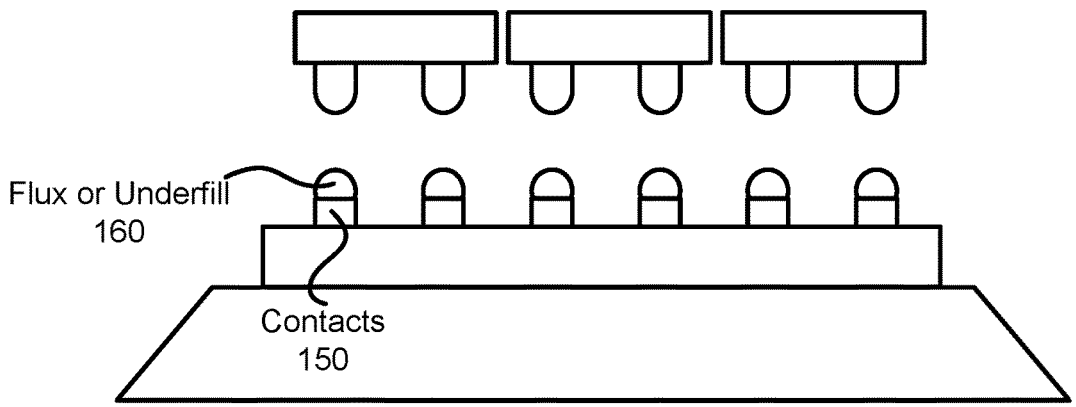
Figure 2C:
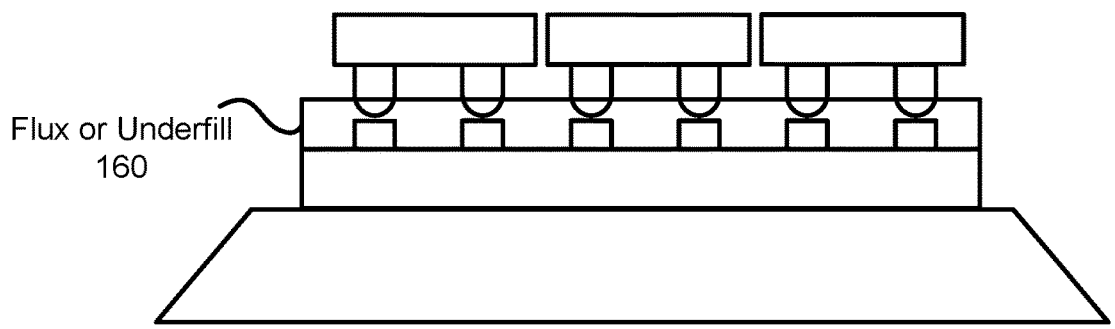

FIGS. 2A-2C illustrate a sequence of schematic diagrams for bonding electrodes 140 of LED dies 110 and contacts 150 of the display substrate 120, according to one embodiment. FIG. 2A is a cross sectional view of flux or underfill 160 applied to the electrodes 140 prior to placement of the LEDs 110 on the display substrate 120, according to one embodiment. FIG. 2B is a cross sectional view of flux or underfill 160 applied to the contacts 150 prior to placement of the LEDs 110 on the display substrate 120, according to one embodiment. Among other advantages, application of the flux or underfill 160 on the electrodes 140 or the contacts 150 can reduce cleaning of the flux or underfill 160 from the display substrate 120 after the bonding process. FIG. 2C is a cross sectional view of flux or underfill 160 coated on the display substrate 120 prior to placement of the LEDs 110 on the display substrate 120, according to one embodiment. The flux or underfill can be applied to the display substrate 120 by spin coating. After the LEDs 110 are bonded to the display substrate 120, remaining flux or underfill may be removed, such as by etching or application of a solvent.

Figure 3A:
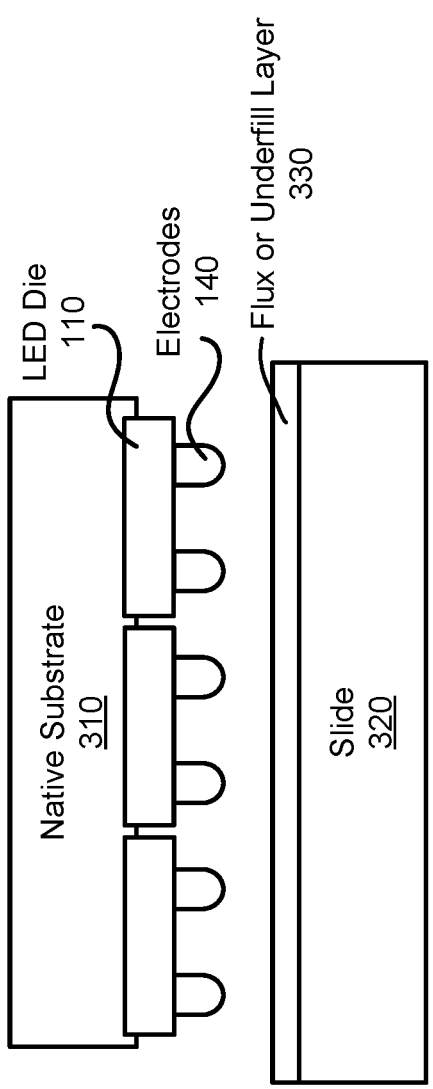
FIGS. 3A-3G illustrate a sequence of schematic diagrams for applying flux or underfill on electrodes of the LED dies and removing a native substrate from the LED dies, according to one embodiment.

FIGS. 3A-3G illustrate a sequence of schematic diagrams for applying flux or underfill 160 on electrodes 140 of the LED dies 110 (e.g., as seen in FIG. 2A) and removing a native substrate 310 from the LED dies 110, according to one embodiment. FIG. 3A is a cross sectional view of a flux or underfill layer 330 on a slide 320 and LEDs 110 attached to a native substrate 310, according to one embodiment. The native substrate 310 can be the substrate that the LEDs 110 were formed on. For example, the native substrate is a sapphire substrate (e.g., GaAs). The flux or underfill layer 330 can be deposited on the slide 320 by spin coating. For example, the slide 320 is made of glass slide coated with rosin as the flux or underfill layer 330.

Figure 3C:
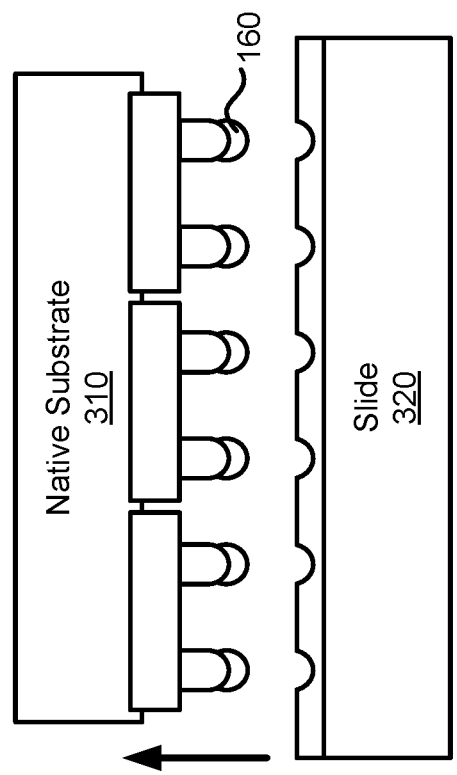
Figure 3B:
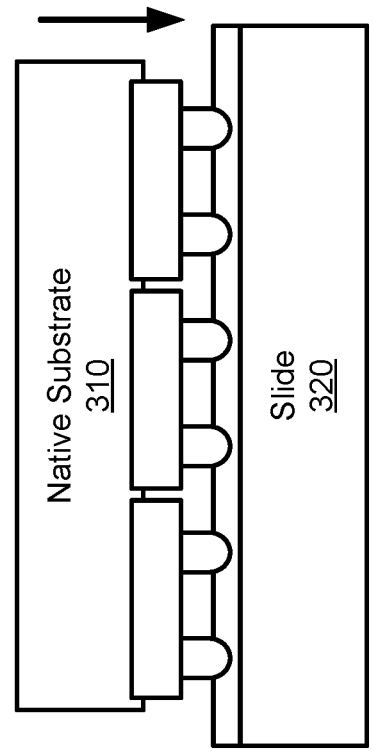

FIG. 3B is a cross sectional view of electrodes 140 of the LEDs 110 dipped into the flux or underfill layer 330, according to one embodiment. FIG. 3C is a cross sectional view of LEDs 110 removed from the flux or underfill layer 330, according to one embodiment. As result of dipping the electrodes 140 of the LEDs 110 into the flux or underfill layer 330, the flux or underfill 160 is applied to at least tips of the electrodes 140.

Figure 3E:
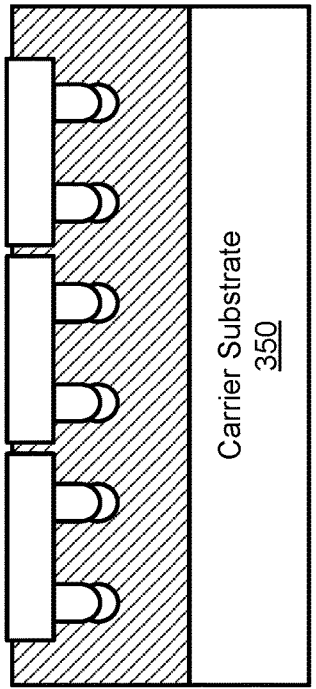
Figure 3G:
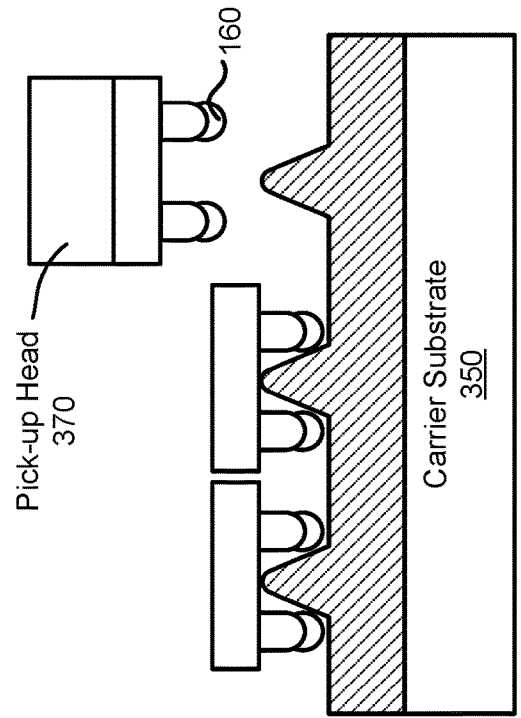
Figure 3D:
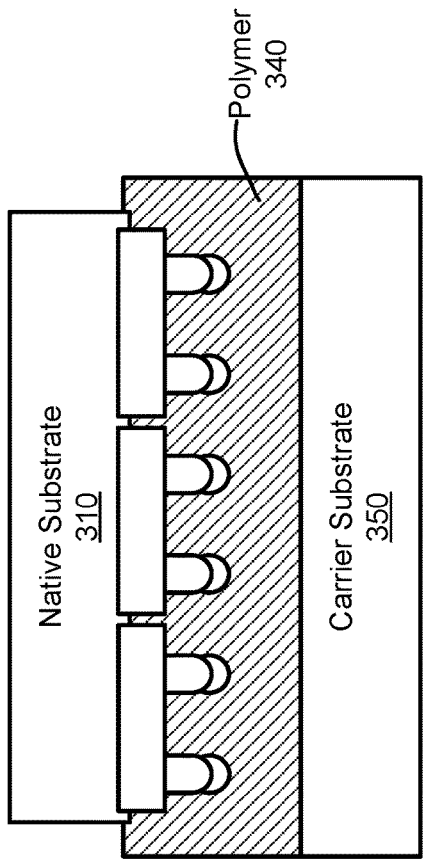

FIG. 3D is a cross sectional view of LEDs 110 attached to the native substrate 310 embedded in a polymer 340 on a carrier substrate 350, according to one embodiment. FIG. 3E is a cross sectional view of LEDs 110 embedded in a polymer 340 on the carrier substrate 350 and detached from the native substrate 310, according to one embodiment. The native substrate 310 can be removed by wet etching or laser lift off (LLO), for example. After the native substrate 310 is removed, the carrier substrate 350 with the LEDs 110 can be moved to a different facility or location for further processing of the LEDs 110. During such moving process, the polymer 340 firmly holds the LEDs 110 in place.

Figure 3F:
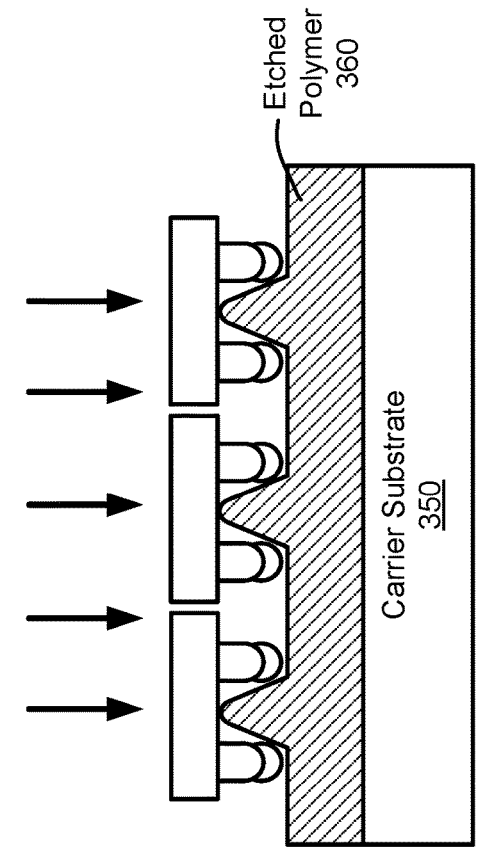

FIG. 3F is a cross sectional view of LEDs 110 attached to an etched polymer 360, according to one embodiment. After the native substrate 310 is removed and the carrier substrate 350 is moved to a desired processing facility or location, portions of the polymer 340 are removed. Portions can be removed by etching, such as radio frequency (RF) dry etching, to create the etched polymer 360. Alternatively, portions of the polymer 340 can be removed by application of a solvent that dissolves the polymer 340.

After removing portions of the polymer 340, the LEDs 110 can be detached from the etched polymer 360, as illustrated in FIG. 3G. By removing portions of the polymer 340, the polymer 340 no longer holds the LEDs 110 firmly in place, and enables the LEDs 110 to be detached from the carrier substrate 340 (e.g., by a pick-up head 370). After detaching from the etched polymer 360, the LEDs 110 with the flux or underfill 160 can be aligned and placed on a display substrate 120. A pick-up head 370 and aligning and placing LEDs 110 on a display substrate 120 are further described with reference to FIGS. 7-10.

Due to adhesive properties of the flux or underfill 160, the flux or underfill 160 allows multiple LEDs (e.g., all desired LEDs) to be placed prior to bonding. After an LED 110 is placed, adhesive properties of the flux or underfill 160 can temporarily hold the LED 110 in place, attached to the display substrate 120. The adhesive properties of the flux or underfill 150 allow a pick-up head 370 to detach from an LED 110 placed on the display substrate 120 and perform subsequent pick and place operations multiple times. After the LEDs 110 are aligned and placed on the display substrate 120, the LEDs 110 can be simultaneously bonded in parallel to the display substrate 120 by forming metallic contacts 130. In some embodiments, pressure is applied to the LEDs 110 and display substrate 120 during the bonding process to assist in forming metallic contacts 130, as described below in detail with reference to FIGS. 4A-5.

Figure 4B:
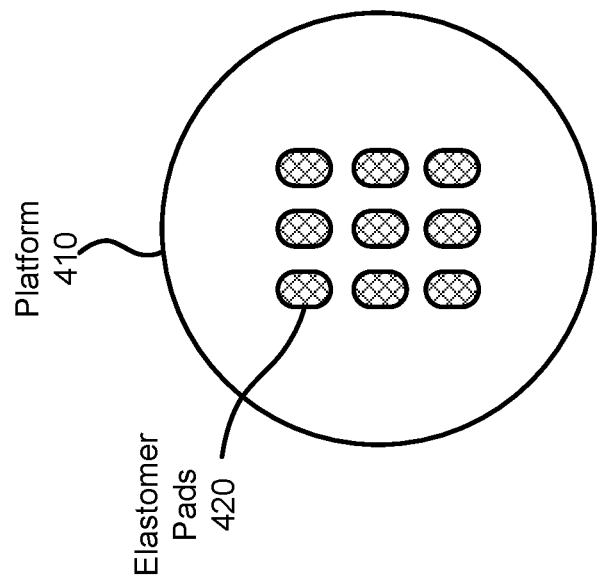
FIG. 4B is a bottom view of the platform with elastomer pads, according to one embodiment.
Figure 4A:
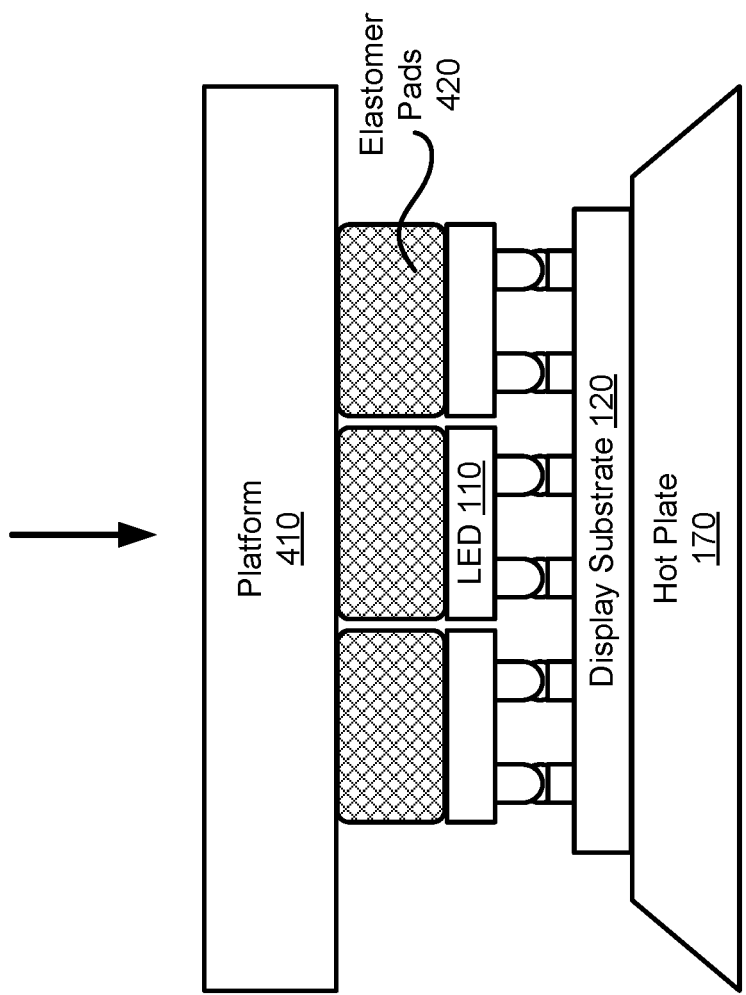
FIG. 4A is a cross sectional view of a platform with elastomer pads attached to LEDs on a substrate, according to one embodiment.

FIG. 4A is a cross sectional view of a platform 410 with elastomer pads 420 attached to LEDs 110 on a display substrate 120, according to one embodiment. FIG. 4B is a bottom view of the platform 410 with elastomer pads 420, according to one embodiment. The platform 410 with elastomer pads 420 can be used to apply pressure (e.g., uniformly) on the LEDs 110 towards the display substrate 120 by applying pressure on the platform 410. Alternative pick and place methods can be used other than a platform with elastomer pads, such as mechanical gripers or vacuum chucks.

In some embodiments, each elastomer pad 420 is in contact with a single LED 110. Due to the discrete elastomer pads 420, lateral movement of the LEDs 110 on the display substrate 120 can be proportional to the coefficient of thermal expansion (CTE) of the platform 410. Thus, if the platform has a negligible CTE, such as fused silica platform, the lateral movement of the LEDs 110 during the bonding process can be reduced.

Figure 5:
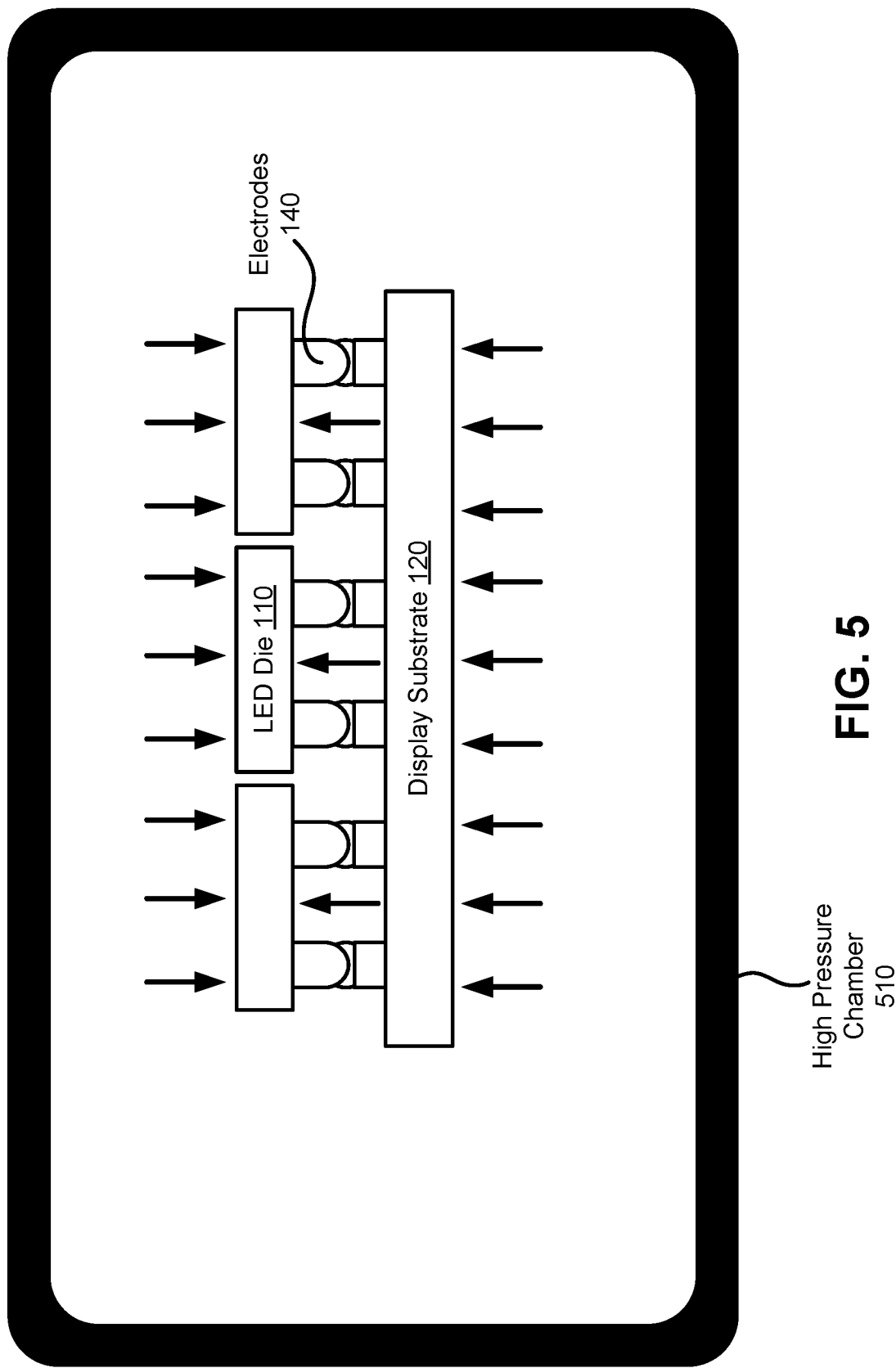
FIG. 5 is a cross sectional view of a high-pressure chamber containing LEDs on a substrate, according to one embodiment.

FIG. 5 is a cross sectional view of a high-pressure chamber 510 containing LEDs 110 on a display substrate 120, according to one embodiment. By increasing the internal pressure of the high-pressure chamber 510, the ambient pressure on the LEDs 110 and display substrate 120 increases. Due to Pascal's law, the increase in ambient pressure results in a net downward force on the LEDs 110, due to a difference in surface area between the bottom and top surfaces of the LEDs 110.

During the bonding process, a hot plate 170 or heating system (neither shown in FIG. 5) can heat the gas within the high-pressure chamber 150. For example, a heating system increases the gas in the chamber to 300° C. Among other advantages, since no solid object applies pressure on the LEDs 110, the high-pressure chamber can reduce lateral movement of the LEDs 110 during the bonding process. For example, lateral movement can be caused by a CTE mismatch when a solid object applies pressure on the LEDs 110. Thus, lateral alignment of the placed LEDs 110 on the display substrate 120 can be preserved when forming the metallic contacts 130.

Figure 6:
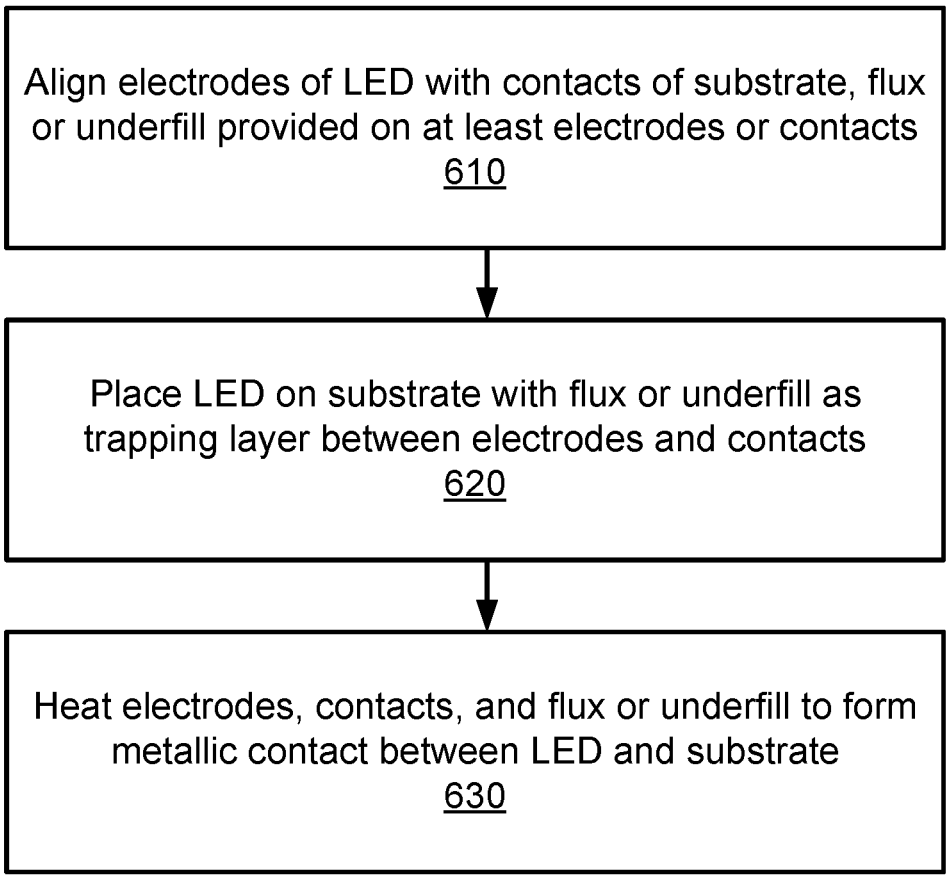
FIG. 6 is a flow chart illustrating a method for using flux or underfill to temporarily attach and bond an LED to a substrate, according to one embodiment.

FIG. 6 is a flow chart illustrating a method for using flux or underfill to temporarily attach and bond an LED to a substrate, according to one embodiment. The steps of method may be performed in different orders, and the method may include different, additional, or fewer steps.

Electrodes of a first light emitting diode (LED) die are aligned 610 with contacts of a substrate. Flux or underfill is provided on at least the electrodes or the contacts. In some embodiments, the flux or underfill is rosin.

The first LED die is placed 620 on the substrate. The flux or underfill forms a trapping layer between the electrodes and the contacts. In some embodiments, the LED die is aligned with and placed on the substrate by a pick-up head. After placing the LED die on the substrate, the pick-up head is detached from the LED die due to adhesive forces of the flux or underfill securing the first LED die to the substrate. For example, the pick-up head is performing a pick and place operation for multiple LED dies.

The electrodes, contacts, and flux or underfill are heated 630 to form a metallic contact between the first LED die and the substrate. In some embodiments, the electrodes, the contacts, and the flux or underfill are selectively heated by focusing laser light.

In some embodiments, the flux or underfill is provided on the electrodes, and at least tips of the electrodes are coated with the flux or underfill by dipping the tips into a flux or underfill layer. In some embodiments, the electrodes having at least the tips coated with the flux or underfill are embedded in a polymer. After embedding the electrodes in a polymer, a native substrate is removed from the first LED die. The native substrate is a substrate on which the first LED die was fabricated. The native substrate is removed prior to aligning the electrodes with the contacts. In some embodiments, portions of the polymer surrounding the electrodes are etched. After etching the portions of the polymer, the first LED die is picked up by a pick-up head for aligning and placing the first LED die on the substrate.

Figure 7:
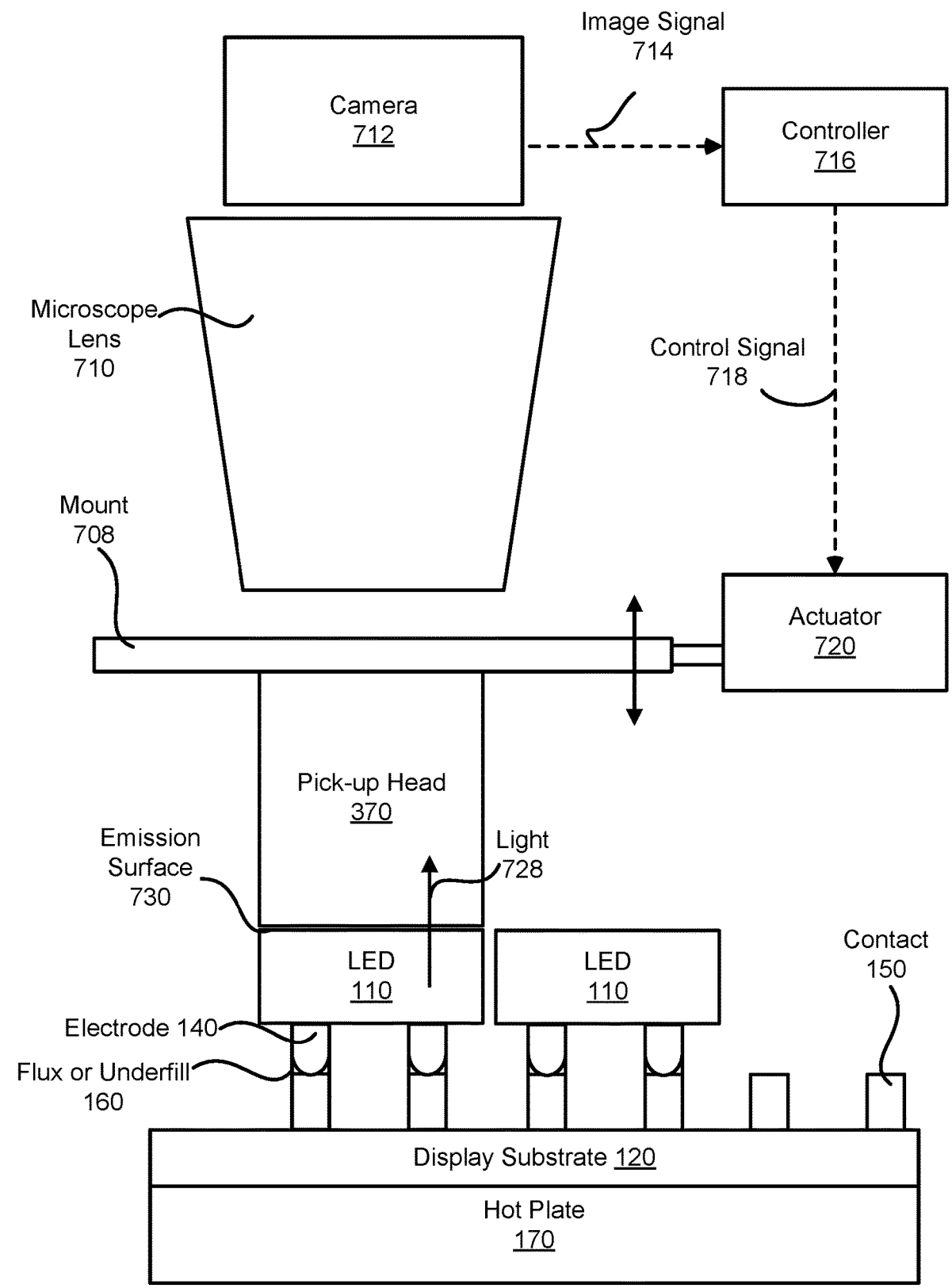
FIG. 7 is a schematic diagram illustrating an operation of a pick-up head placing an LED onto a substrate, according to one embodiment.

FIG. 7 is a cross sectional view illustrating an operation of a pick-up head 370 placing an LED 110 onto a display substrate 120, according to one embodiment. The pick-up head 370 is attached to the LED 110 and places the LED 110 onto the display substrate 120 by aligning contacts 150 of the display substrate 120 with electrodes 140 of the LED 110. If a voltage difference is applied between the contacts 150 and if the LED 110 is properly placed, the LED 110 can emit light 728 from an emission surface 730. A hot plate 170 is connected to the display substrate 120. A camera 712 is placed above a microscope lens 710 to capture images of the LED 110 being placed onto the display substrate 120 from the top. The camera 712 generates image signals 714 that function as real time feedback to correct improper LED 110 placement during the placement process. The camera 712 sends image signals 714 to the controller 716. Using the image signals 714, the controller 716 sends control signals 718 to the actuator 720. The actuator is attached to the pick-up head 370 via a mount 708. In some embodiments, FIG. 7 includes different and/or other components than those shown in FIG. 7. For example, the LED 110 can include an elastomeric material layer that allows the LED 110 to be adhesively attached to a pick-up surface of the pick-up head 370. In another example, the LED 110 can be temporarily attached to the pick-up head by mechanical gripers or vacuum chucks.

The pick-up head 370 places LEDs 110 onto the display substrate 120. The pick-up head 370 may also be referred to as a pick and place head. The pick-up head 370 can support any number of LEDs 110 and can place multiple LEDs 110 onto the display substrate 120 at once. For example, an array of LEDs 110 and their electrodes 140 can be aligned with and placed on an array of contacts 150 in a single step (this may be referred to as a monolithic approach). Before placing the LED 110, the pick-up head 370 may pick up the LED 110 from a native substrate or a carrier substrate 350. Picking up an LED 110 from a native or carrier substrate 350 and aligning and placing the LED 110 on the display substrate 120 can be referred to as a pick and place operation. Due to the flux or underfill 160, the pick-up head 370 can perform multiple pick and place operations without bonding each LED 110 to the display substrate 120. In some embodiments, a portion of the pick-up head 370 is transparent to allow the camera 712 to capture images of the LED 110 through the pick-up head 370. In some embodiments, one or more LEDs 110 are repositioned once they are positioned on the display substrate 120, for example, because the electrodes 140 are misaligned with the contacts 150. In these embodiments, the flux or underfill can be flexible enough to stay between the electrodes 140 and the contacts 150.

The mount 708 is an actuated slide that supports the pick-up head 370. The mount 708 can support multiple pick-up heads 706. For example, the mount 708 supports two pick-up heads 706 such that two LEDs 110 can be placed at once. In some embodiments, the mount 708 is made of a transparent material, such as glass.

The actuator 720 is connected to the mount 708 and controls movement of the mount 708. By moving the mount 708, the actuator 720 aligns the pick-up head 370 with the display substrate 120. This allows the pick-up head 370 to place one or more LEDs 110 on the display substrate 120 by aligning the electrodes 140 with the contacts 150. In some embodiments, the actuator 720 is a multiple degree of freedom actuator, such as an actuator that is configured to move the mount 708 up and down, left and right, forward and back. The actuator can also adjust yaw, tilt, or rotate the mount 708. In some embodiments, multiple actuators 720 connected to multiple mounts 708 perform LED 110 placement tasks in parallel to increase throughput.

The camera 712 is an image capturing device that captures the images of the LED 110. In some embodiments, the camera 712 captures images to determine whether the LED 110 is emitting light 728. The camera 712 can also capture images to determine the placement location and angle of a placed LED 110. The camera 712 can also enable detection of luminance of the light 728 emitted by the LED 110.

The microscope lens 710 magnifies the LED 110 for the camera 712. The microscope lens 710 can allow the camera 712 to view and distinguish light 728 from LEDs 110.

The controller 716 is a computing device that controls the placement of LEDs 110 by providing control signals 718 to the actuator 720. The control signals 718 are determined by the controller 716 and can be based on the image signals 714 received from the camera 712. The controller 716 can analyze the emitting state or the placement of the LED 110 to determine if the placement of the LED 110 should be adjusted. The controller 716 is further described with reference to FIGS. 8 and 9.

Figure 8:
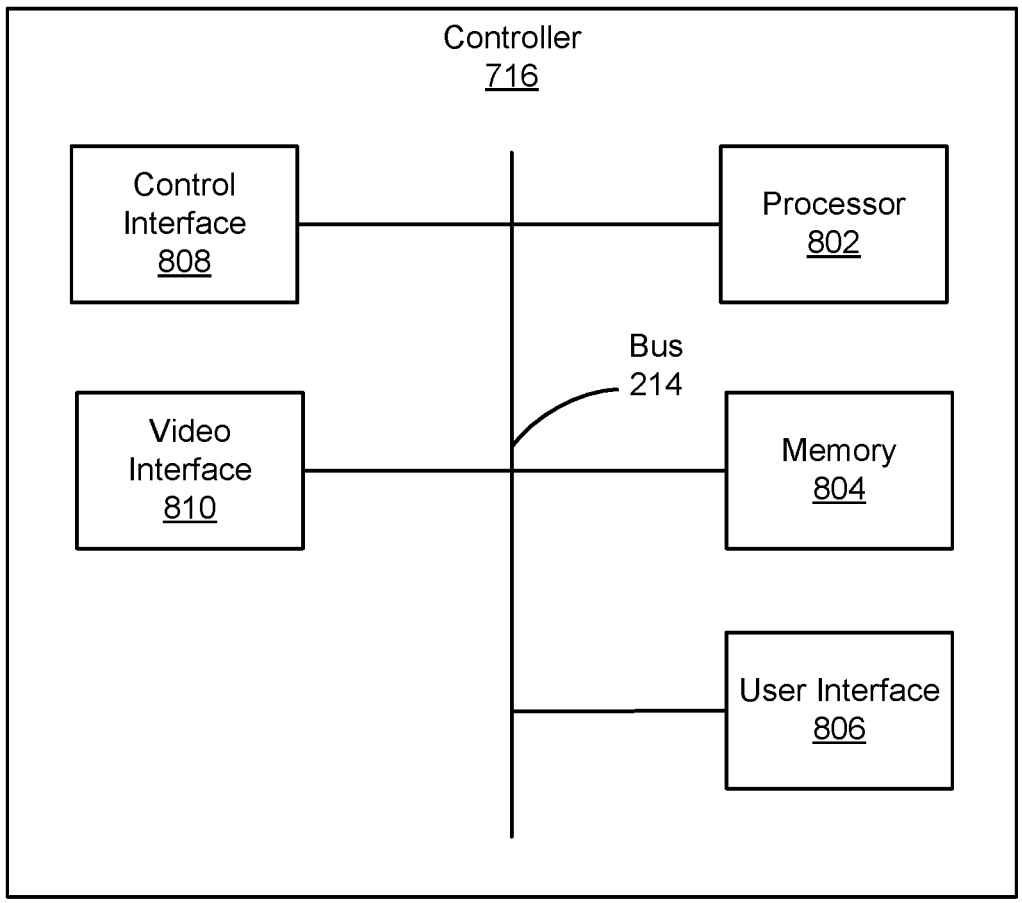
FIG. 8 is a block diagram of the controller, according to one embodiment.

FIG. 8 is a block diagram of the controller 716, according to one embodiment. The controller 716 may include, among other components, a processor 802, a memory 804, a user interface 806, a video interface 870, and a control interface 808. The modules 802 through 808 communicate via a bus 874. Some embodiments of the controller 716 have different and/or other components than those shown in FIG. 8.

The controller 716 is a computer device that may be a personal computer (PC), a video game console, a tablet PC, a smartphone, or any machine capable of executing instructions (sequential or otherwise) that specify actions to be taken by that device. The controller 716 can operate as a standalone device or a connected (e.g., networked) device that connects to other machines. Furthermore, while only a single device is illustrated, the term "device" shall also be taken to include any collection of devices that individually or jointly execute instructions to perform any one or more of the methodologies discussed herein.

The processor 802 is a processing circuitry configured to carry out instructions stored in the memory 804. For example, the processor 802 can be a central processing unit (CPU) and/or a graphics processing unit (GPU). The processor 802 may be a general-purpose or embedded processor using any of a variety of instruction set architectures (ISAs). Although a single processor 802 is illustrated in FIG. 8, the controller 716 may include multiple processors 802. In multiprocessor systems, each of the processors 802 may commonly, but not necessarily, implement the same ISA. The processor 802, or a part of it, may be specifically designed for efficient processing of graphical images, such as those received in the image signals 714. For example, the processor 802 may perform one or more image processing steps to determine an emitting state of an LED 110.

The memory 804 is a non-transitory machine-readable medium on which is stored data and instructions (e.g., software) embodying any one or more of the methodologies or functions described herein. For example, the memory 804 may store instructions that when executed by the processor 802 configures the processor 802 to perform the method described below in detail with reference to FIG. 6. Instructions may also reside, completely or at least partially, within the processor 802 (e.g., within the processor's cache memory) during execution thereof by the controller 716.

The term "machine-readable medium" should be taken to include a single medium or multiple media (e.g., a centralized or distributed database, or associated caches and servers) able to store instructions. The term "machine-readable medium" shall also be taken to include any medium that is capable of storing instructions for execution by the device and that cause the device to perform any one or more of the methodologies disclosed herein. The term "machine-readable medium" includes, but is not limited to, data repositories in the form of solid-state memories, optical media, and magnetic media.

The user interface 806 is hardware, software, firmware, or a combination thereof that enables a user to interact with the controller 716. The user interface 806 can include an alphanumeric input device (e.g., a keyboard) and a cursor control device (e.g., a mouse, a trackball, a joystick, a motion sensor, or other pointing instrument). For example, a user uses a keyboard and mouse to select placement parameters for placing a set of LEDs 110 on the display substrate 120.

The control interface 808 transmits control signals 718 to the actuator 720. For example, the control interface 808 is a circuit or a combination of circuits and software that interfaces with the actuator 720 to transmit the control signals 718.

The video interface 870 is a circuit or a combination of circuit and software that receives image data via the image signals 714 from the camera 712 and transfers the image data to the memory 804 and/or processor 802 to be stored and processed.

The controller 716 executes computer program modules for providing functionality described herein. As used herein, the term "module" refers to computer program instructions and/or other logic used to provide the specified functionality. Thus, a module can be implemented in hardware, firmware, and/or software. In some embodiments, program modules formed of executable computer program instructions are loaded into the memory 804, and executed by the processor 802. For example, program instructions for the method 700 describe herein can be loaded into the memory 804, and executed by the processor 802.

Figure 9:
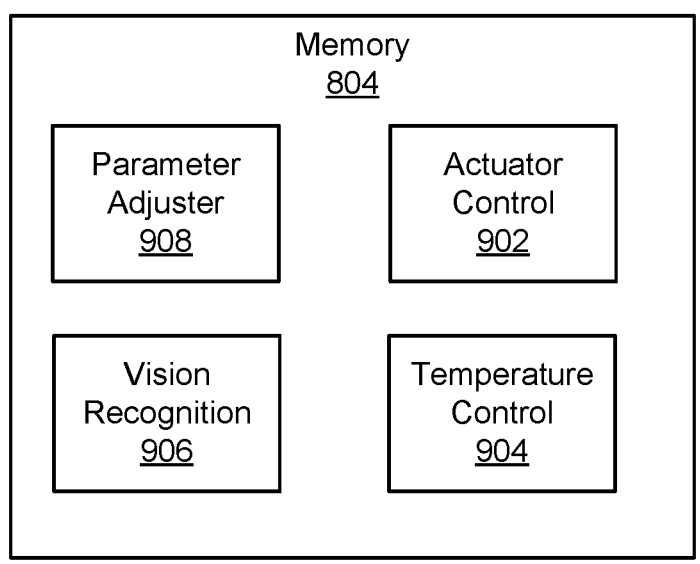
FIG. 9 is a block diagram of software modules in the memory of the controller, according to one embodiment.

FIG. 9 is a block diagram of software modules in the memory 804 of the controller 716, according to one embodiment. The memory 804 may store, among other modules, an actuator control module 902, a temperature control module 904, a vision recognition module 906, and a parameter adjuster module 908. The memory 804 may include other modules not illustrated in FIG. 9.

The actuator control module 902 provides instructions for generating control signals 718 to control the actuator 720 to perform pick and place operations and adjust one or more placement parameters. The placement parameters are parameters that relate to placing one or more LEDs 110 on the display substrate 120. The placement parameters include a placing location, a placing angle (e.g., including a rotation angle and three tilt angles), a placing pressure, a placing temperature, and a placing time. The placing location is the location of the LED 110 on the display substrate 120. The placing angle is the angle of the LED 110 relative to the display substrate 120. The placing pressure is the pressure applied to the LED 110 by the pick-up head 370 once it is placed on the display substrate 120. The placing time is the amount of time that the placing pressure and the placing temperature are applied to the LED 110. The placing temperature is the temperature of the display substrate 120 or a temperature change of the display substrate 120 during the placing of the LED 110.

The temperature control module 904 sets the temperature of the hot plate 170. As such, the temperature control module 904 sets the placing temperature. The temperature control module 904 can also set the temperature of the hot plate 170 during the bonding process.

Parameters that relate to placement and bonding include heating ramp profile, flux or underfill behavior, underfill behavior, the influence of lateral and vertical movements (e.g. caused by thermal expansion), the influence of metal oxides, allowable pressure range, and allowable temperature range.

The heating ramp profile represents the temperature evolution during bonding. For example, the temperature can increase at a rate of 3° Celsius per second (C/s) up to 750° C., then increase at a rate of 70° C./s up to 270° C., then remain constant for five minutes (so called dwell time), then decrease at a controlled rate of 2° C./s. The heating ramp profile can be optimized experimentally and/or based on theoretical simulations.

Since underfills and fluxes can be liquid and freely move (e.g., when heated), their presence and evolution during bonding can be optically monitored during the bonding process (e.g., using the same optical feedback system for LED alignment and placement).

Lateral and vertical movement can occur as a result of heat expansion during the bonding process. For example, the display substrate 120 and hot plate 170 can expand as their respective temperatures increase. The amount of expansion can depend on the coefficient of thermal expansion (CTE) of each material (e.g. it is proportional to the temperature and occurs in all directions).

Lateral and vertical movements may be monitored and controlled during the bonding process. For example, when applying pressure by a platform 410 with elastomer pads 420, vertical movements may be monitored such that the pressure between the display substrate 120 and the LED 110 remains constant during bonding.

The vision recognition module 906 performs analysis on the image data in the image signals 714 to determine the emitting states of the LED 110 and the placement of the LED 110. The vision recognition module 906 can determine whether an emitting state fails one or more criteria. The criteria can form a standard for determining proper placement of one or more LEDs 110. For example, one of the criteria relates to whether the LED 110 emits light 728 or the LED 110 emits an amount of lumens above a threshold. An emitting state can fail the criteria for any number of reasons, such as, for example, an LED 110 is placed outside a target placing location, placing angle, placing time, placing pressure, placing temperature, etc.

The parameter adjuster module 908 provides instructions for monitoring the placement and bonding parameters and adjusting them in real time as needed. For example, the parameter adjuster module 908 adjusts the placement parameters in response to one or more emitting states failing criteria. The parameter adjuster module 908 may determine which parameters to adjust based on the failed criteria. For example, if an LED 110 is incorrectly placed on the display substrate 120 (e.g., between contacts 150), the placing location can be adjusted. In another example, if the LED 110 moves after placement, the placing time and pressure may be adjusted. The adjusted parameters can be temporarily adjusted for the LED 110 currently being placed or permanently adjusted for the current and future placement of LEDs 110. The parameter adjuster module 908 can continually adjust the placement parameters until one or more emitting states satisfy the criteria. This can allow for optimizing the placement parameters of the placement process and allow insight into root causes of failed LED 110 placement.

Figure 10:
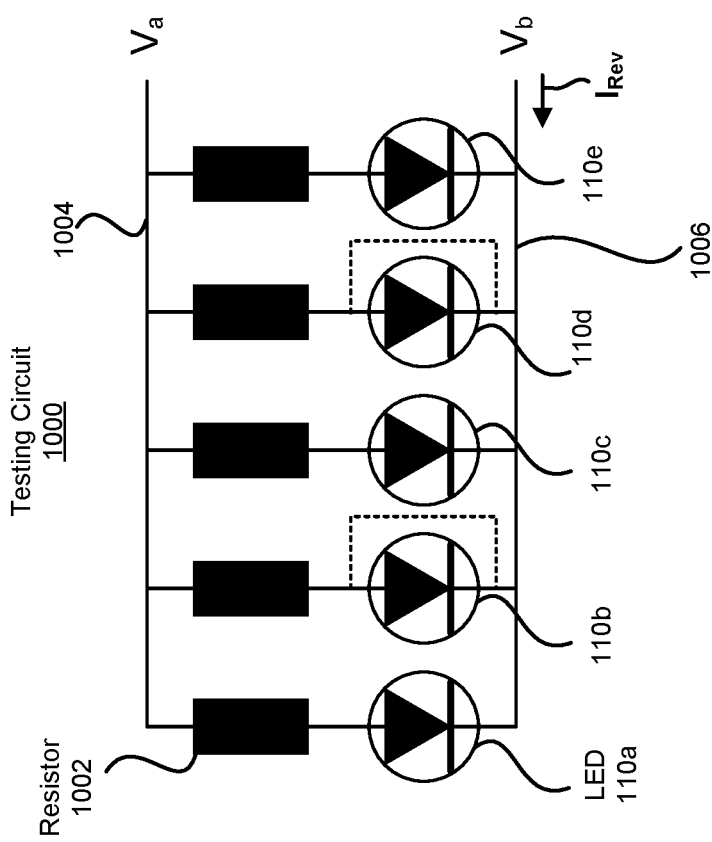
FIG. 10 is a circuit diagram of a testing circuit on a substrate, according to one embodiment.

FIG. 10 is a circuit diagram of a testing circuit 1000 on a display substrate 120, according to one embodiment. The testing circuit 1000 can be used for experimental purposes, for example, to test a new placing scheme or new placement parameters. The arrangement of the testing circuit 1000 allows parallel testing of the LEDs 110 on the circuit using only two connecting wires. The testing circuit 1000 includes a top wire 1004, a bottom wire 1006, LEDs 110a through 704e (represented as diodes), and resistors 1002 electrically connected between the top wire 1004 and LEDs 110a through 704e. The dashed lines around LEDs 110b and 704d represent shorts between the contacts 150 on the display substrate 120.

By applying a high supply voltage $V_a$ to the top wire 1004 and low supply voltage $V_b$ to the bottom wire 1006 ($V_a > V_b$), a voltage bias can be applied across the LEDs 110. As a result, LEDs 110a, 704c, and 704e will emit light 728. However, LEDs 110b and 704d will not emit light 728, due to the shorts. Despite the local circuit shorts near LED 110b and LED 110d, the resistors 1002 prevent the entire testing circuit 1000 from shorting. For example, the resistors 1002 each have a resistance of 750 KΩ.

Furthermore, the relative voltage levels of applied voltages $V_a$, $V_b$ can be reversed to apply a negative voltage bias across the top and bottom wires ($V_a < V_b$). By doing so, reverse current $I_{Rev}$ flows from the bottom wire 1006 to the upper wire 1004 via the shorted LEDs 110b and 704d. The number of shorted LEDs in the testing circuit 1000 can be estimated by measuring $I_{Rev}$. For example, if each shorted LED allows 70 μA of current to pass through, 20 μA of reverse current $I_{Rev}$ may indicate that two LEDs are shorted.

Assuming that the LEDs 110 are functioning properly (e.g., they were tested before being picked up by the pick-up head 370), the results of the positive and negative voltage bias can be used in combination with the images captured by the camera 712 to determine the number of improperly placed LEDs 110. For example, if no $I_{Rev}$ is measured, yet one or more LEDs 110 do not emit light 728 when current is in the forward direction ($V_a > V_b$), then it may be determined that one or more LEDs 110 were improperly placed on the display substrate 120.

Figure 11A:
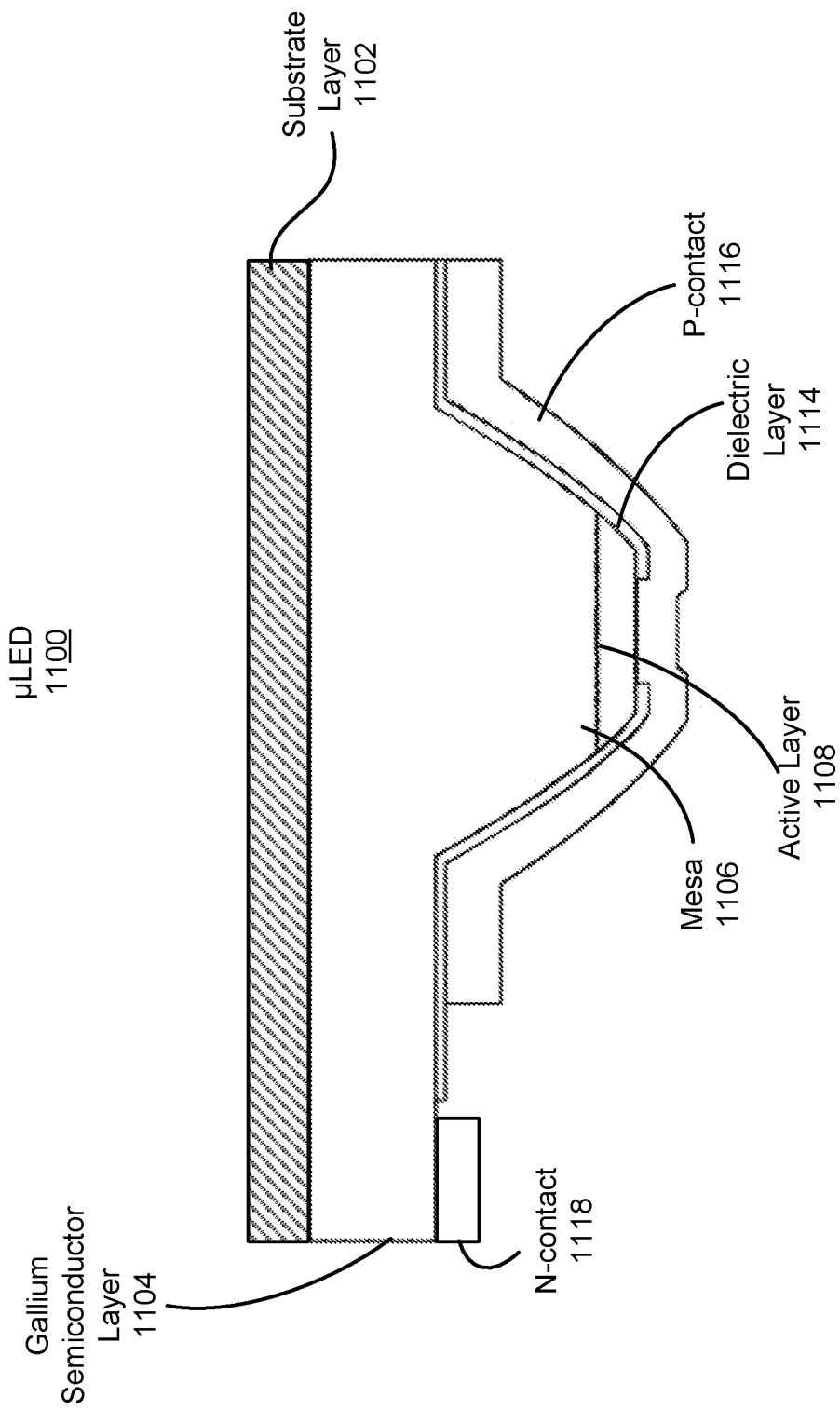
Figure 11B:
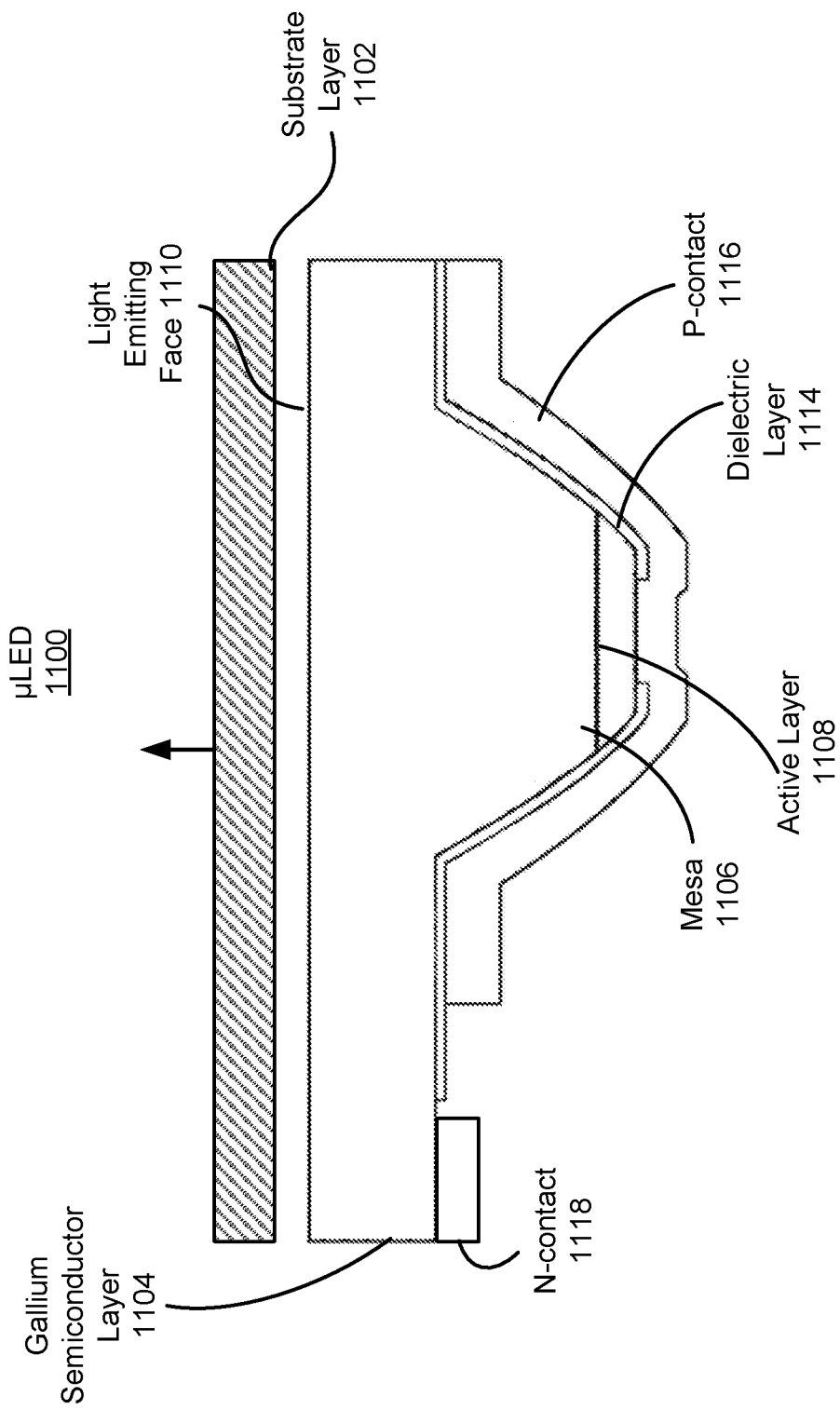

FIGS. 11A through 11C show schematic cross sections of a μLED 1100, according to some embodiments. The μLED 1100 is an example of a visible or non-visible LED that may be positioned on a surface of a display substrate (e.g., display substrate 120) to emit collimated visible or invisible light. The feature size of the μLED 1100 (e.g., the diameter) may range from sub-micrometers to tens of micrometers (e.g., from 0.1 μm to 10 μm). The pitch (e.g., spacing between μLEDs) may similarly range from sub-micrometers to tens of micrometers.

The μLED 1100 may be formed on a substrate layer 1102, and may include, among other components, a gallium semiconductor layer 1104 disposed on the substrate layer 1102, a dielectric layer 1114 disposed on the gallium semiconductor layer 1104, a p-contact 1116 disposed on a first portion of the dielectric layer 1114, and an n-contact 1118 disposed on a second portion of the gallium semiconductor layer 1104. In some embodiments, the gallium semiconductor layer 1104 is grown on the substrate layer 1102 as an epitaxial layer.

As illustrated in FIG. 11B, the substrate layer 1102 may be removed from the surface of the gallium semiconductor layer 1104 of the μLED 1100 to reveal a light emitting face 1110 of the μLED 1100. In some embodiments, the substrate layer 1102 is separated from the gallium semiconductor layer 1104 using a laser lift-off (LLO) process.

In some embodiments, the gallium semiconductor layer 1104 is shaped into a mesa 1106. An active (or light emitting) layer 1108 (or "active light emitting area") is included in the structure of the mesa 1106. The mesa 1106 has a truncated top, on a side opposed to the light transmitting or emitting face 1110 of the μLED 1100. The mesa 1106 also has a near-parabolic shape to form a reflective enclosure for light generated within the μLED 1100.

FIG. 11C illustrates the μLED 1100 after removal of the substrate layer 1102. Upon removal of the substrate layer 1102, the μLED 1100 may be placed on a display substrate (not shown), and operated to emit light. The arrows 1112 show how light emitted from the active layer 1108 is reflected off the p-contact 1116 and internal walls of the mesa 1106 toward the light emitting face 1110 at an angle sufficient for the light to escape the μLED device 1100 (i.e., within an angle of total internal reflection). During operation, the p-contact 1116 and the n-contact 1118 connect the μLED 1100 to a display substrate (not shown).

In some embodiments, the parabolic shaped structure of the μLED 1100 results in an increase in the extraction efficiency of the μLED 1100 into low illumination angles when compared to unshaped or standard LEDs. For example, standard LED dies generally provide an emission full width half maximum (FWHM) angle of 120°, which is dictated by the Lambertian reflectance from a diffuse surface. In comparison, the μLED 1100 can be designed to provide controlled emission angle FWHM of less than standard LED dies, such as around 60°. This increased efficiency and collimated output of the μLED 1100 can produce light visible to the human eye with only nano-amps of drive current.

The μLED 1100 may include an active light emitting area that is less than standard LEDs, such as less than 2,000 μm². The μLED 1100 directionalizes the light output from the active light emitting area and increases the brightness level of the light output. The μLED 1100 may be less than 20 μm in diameter with a parabolic structure (or a similar structure) etched directly onto the LED die during the wafer processing steps to form a quasi-collimated light beam emerging from the light emitting face 1110 of the μLED 1100.

As used herein, "directionalized light" includes collimated and quasi-collimated light. For example, directionalized light may be light that is emitted from a light generating region of a LED and at least a portion of the emitted light is directed into a beam having a half angle. This may increase the brightness of the LED in the direction of the beam of light.

A μLED 1100 may include a circular cross section when cut along a horizontal plane as shown in FIGS. 11A-11C. A μLED 1100 may have a parabolic structure etched directly onto the LED die during the wafer processing steps. The parabolic structure may comprise a light emitting region of the μLED 1100 and reflects a portion of the generated light to form the quasi-collimated light beam emitted from the light emitting face 1110.

As discussed above, the substrate layer 1102 may correspond to a glass or sapphire substrate. The gallium semiconductor layer 1104 may include a p-doped GaN layer, an n-doped GaN layer, and the active layer 1108 between the p-doped and n-doped GaN layers. The active layer may include a multi-quantum well structure. The substrate layer 1102 is transparent to a laser projected by the laser projector 126, which may be applied through the substrate layer 1102 to the gallium semiconductor layer 1104. In other embodiments, the substrate layer 1102 may comprise a gallium compound, as such GaAs. The gallium semiconductor layer 1104 may include a p-doped GaAn layer, an n-doped GaAs layer, and the active layer 1108 between the p-doped and n-doped GaAs layers. In some embodiments, the μLED 1100 includes a Gallium phosphide (GaP) substrate 1102 for increased transparency relative to GaAs, such as for red visible LEDs. In some embodiments, the substrate layer 1102 is a semiconductor substrate, such as a silicon substrate. When a non-transparent substrate layer 1102 is used, a laser may be applied at the interface of the substrate layer 1102 and the gallium semiconductor layer to separate the layers and form the gallium material to facilitate pick and place.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A method comprising:
    aligning electrodes of a first light emitting diode (LED) die with contacts of a substrate, flux or underfill provided on at least the electrodes or the contacts;
    placing, by a pick-up head configured to place one or more LEDs on the substrate, the first LED die on the substrate with the flux or underfill forming a trapping layer between the electrodes and the contacts;
    after placing the first LED die on the substrate, detaching the pick-up head from the first LED die, adhesive forces of the flux or underfill securing the first LED die on the substrate during detaching of the pick-up head from the first LED die; and
    heating the electrodes, the contacts, and the flux or underfill to form a metallic contact between the first LED die and the substrate.

2. The method of claim 1, further comprising placing a second LED die on the substrate prior to the heating.

3. The method of claim 2, wherein the second LED die is placed on the substrate simultaneously with the placing of the first LED die on the substrate.

4. The method of claim 1, wherein the flux or underfill is provided on the electrodes, and at least tips of the electrodes are coated with the flux or underfill by dipping the tips into a flux or underfill layer.

5. The method of claim 4, further comprising:
embedding the electrodes having at least the tips coated with the flux or underfill in a polymer; and
removing a native substrate on which the first LED die was fabricated after embedding the electrodes in the polymer, prior to aligning the electrodes with the contacts.

6. The method of claim 5, further comprising:
etching portions of the polymer surrounding the electrodes; and
after etching the portions of the polymer, picking up the first LED die by a pick-up head for aligning and placing the first LED die on the substrate.

7. The method of claim 1, wherein the metallic contact is formed without applying external pressure on the first LED die towards the substrate during the heating.

8. The method of claim 1, wherein pressure is applied on the first LED die towards the substrate by placing the first LED die and the substrate in a pressure chamber during the heating.

9. The method of claim 1, further comprising:
placing a platform with an elastomer pad on the first LED die; and
applying pressure on the first LED die towards the substrate by applying pressure on the platform with the elastomer pad.

10. The method of claim 1, wherein the electrodes, the contacts, and the flux or underfill are selectively heated by focusing laser light.

11. The method of claim 1, wherein the flux or underfill is rosin or Benzocyclobutene.

12. The method of claim 1, further comprising:
subsequent to placing the first LED die on the substrate, repositioning the first LED die to align the electrodes with the contacts, the flux or underfill remaining between the electrodes and the contact.

13. The method of claim 12, wherein the first LED die is repositioned based on image signals received from a camera, wherein the camera captures images of the first LED die through a microscope lens.

* * * * *